US011599416B1

(12) United States Patent
Huang et al.

(10) Patent No.: US 11,599,416 B1
(45) Date of Patent: Mar. 7, 2023

(54) MEMORY SUB-SYSTEM USING PARTIAL SUPERBLOCKS

(71) Applicant: Micron Technology, Inc., Boise, ID (US)

(72) Inventors: Jianmin Huang, San Carlos, CA (US); Xiangang Luo, Fremont, CA (US); Kulachet Tanpairoj, San Mateo, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/464,290

(22) Filed: Sep. 1, 2021

(51) Int. Cl.
G06F 11/00 (2006.01)
G06F 11/10 (2006.01)
G06F 11/07 (2006.01)
G06F 3/06 (2006.01)

(52) U.S. Cl.
CPC .......... *G06F 11/1068* (2013.01); *G06F 3/064* (2013.01); *G06F 3/0619* (2013.01); *G06F 3/0649* (2013.01); *G06F 3/0679* (2013.01); *G06F 11/076* (2013.01)

(58) Field of Classification Search
None
See application file for complete search history.

(56) References Cited

U.S. PATENT DOCUMENTS

| | | | | |
|---|---|---|---|---|
| 8,572,311 B1* | 10/2013 | Shalvi | ............. | G06F 11/14 711/103 |
| 10,037,152 B2* | 7/2018 | Li | ............. | G06F 13/4068 |
| 2014/0231954 A1 | 8/2014 | Lue | | |
| 2016/0179386 A1 | 6/2016 | Zhang | | |
| 2018/0217892 A1* | 8/2018 | Syu | ............. | G06F 11/1016 |
| 2018/0357160 A1* | 12/2018 | Gorobets | ............. | G06F 12/0253 |
| 2019/0205043 A1* | 7/2019 | Huang | ............. | G06F 3/0631 |
| 2019/0304562 A1* | 10/2019 | Cai | ............. | G06F 3/064 |
| 2019/0310774 A1 | 10/2019 | Oh et al. | | |
| 2020/0004462 A1 | 1/2020 | Kim | | |
| 2020/0042201 A1 | 2/2020 | Huang et al. | | |

(Continued)

FOREIGN PATENT DOCUMENTS

| | | |
|---|---|---|
| KR | 20180009430 | 1/2018 |
| WO | 2017074570 A1 | 5/2017 |

OTHER PUBLICATIONS

N. Shahidi, et al, "Exploring the Potentials of Parallel Garbage Collection in SSDs for Enterprise Storage Systems," SC '16: Proceedings of the International Conference for High Performance Computing, Networking, Storage and Analysis, 2016, pp. 561-572, doi: 10.1109/SC.2016.47. (Year: 2016).*

(Continued)

*Primary Examiner* — Daniel F. McMahon
(74) *Attorney, Agent, or Firm* — Brooks, Cameron & Huebsch, PLLC

(57) ABSTRACT

An apparatus includes a media management superblock component. The media management superblock component determines that a quantity of blocks of a superblock of a non-volatile memory array are bad blocks. The media management superblock component compares the quantity of bad blocks to a bad block criteria. The media management superblock component writes host data to the superblock with the quantity of bad blocks in response to the quantity of bad blocks meeting the bad block criteria.

20 Claims, 6 Drawing Sheets

(56) References Cited

U.S. PATENT DOCUMENTS

| | | | |
|---|---|---|---|
| 2020/0042438 A1* | 2/2020 | Yi | G06F 12/0246 |
| 2020/0098421 A1* | 3/2020 | Alsasua | G11C 7/04 |
| 2021/0026547 A1* | 1/2021 | Peh | G06F 3/0652 |
| 2021/0064288 A1* | 3/2021 | Kanno | G06F 3/0659 |
| 2022/0066646 A1* | 3/2022 | Malshe | G06F 3/0653 |

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017, doi: 10.1109/JPROC.2017.2713127. (Year: 2017).*

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

* cited by examiner

MEMORY SUB-SYSTEM USING PARTIAL SUPERBLOCKS

TECHNICAL FIELD

Embodiments of the disclosure relate generally to memory sub-systems, and more specifically, relate to memory sub-system media management operation using partial superblocks.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
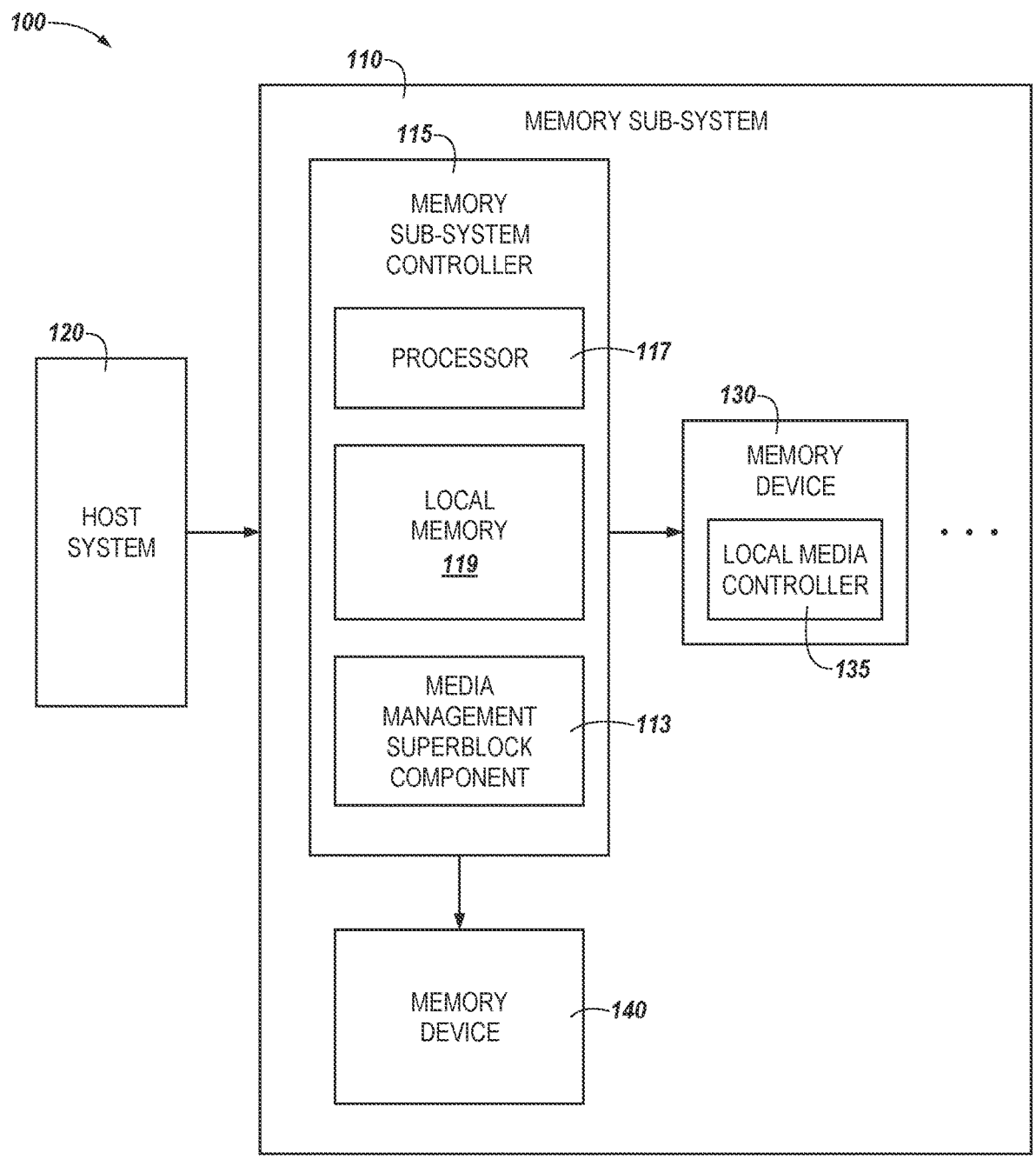
FIG. 1 illustrates an example computing system that includes a memory sub-system in accordance with some embodiments of the present disclosure.

Aspects of the present disclosure are directed to media management operations for using partial superblocks associated with a memory sub-system, in particular to memory sub-systems that include a media management superblock component. A memory sub-system can be a storage device, a memory module, or a hybrid of a storage device and memory module. An example of a memory sub-system is a storage system, such as a solid state drive (SSD). Examples of storage devices and memory modules are described below in conjunction with FIG. 1. In general, a host system can utilize a memory sub-system that includes one or more components, such as "memory devices" that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can be written to in order to store one or more bits of binary information, and has various logic states that correlate to the number of bits being stored. The logic states can be represented by binary values, such as "0" and "1", or combinations of such values. There are various types of cells, such as single level cells (SLCs), multi-level cells (MHLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Performance of a NAND can be determined by the program speed of the NAND. That is, the speed at which it takes to program the pages of a NAND. Systems can improve performance by grouping multiple NAND pages together in order to program the NAND pages concurrently. This can increase system performance by the number of pages grouped together. However, a reduction in number of the pages that are grouped together (sometimes referred to as a superpage) can result in a reduction in performance. It can be important that the number of good blocks of memory in each plane are equal so that a full superblock can be formed. Superblocks of memory that are not fully formed may not be usable by the system. The maximum number of full superblocks that can be formed can be constrained by a plane with the least number of good blocks. A superblock, as used herein, can refer to a set of blocks that span multiple die that are written in an interleaved fashion. In some cases, a superblock may span all the die within an SSD. A superblock may contain multiple blocks from a single die. A superblock may be a unit of management within the SSD.

In some approaches, superblocks that included some bad blocks would limit the number of superblocks that could be used for data storage because superblocks with a particular number of bad blocks (i.e., superblocks that were partial, or not "full," superblocks) could not be used. A bad block can refer to a block of memory that does not function properly. By eliminating these partial, or non-full superblocks, system performance would be decreased. Aspects of the present disclosure address the above and other deficiencies by using partial superblocks, or superblocks with some bad blocks that reduce the superblock to fewer good (or usable) blocks than a full superblock. Several parameters are described below in order to reduce the impact that these partial superblocks will have on system performance while still using the partial superblocks to increase system performance. Such parameters include a minimum number of good blocks per partial superblock, a particular writing distance between partial superblocks, and a delay prior to use of partial superblocks in order to use partial superblocks later in the life of the memory system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIN controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include various combinations of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a media management superblock component 113 (or "MM superblock component," for brevity) that can be configured to orchestrate and/or perform operations to determine criteria (in some examples, thresholds or quantity ranges) for a quantity of blocks of memory and can use various components, data paths, and/or interfaces of the memory sub-system 110 to do so. The media management superblock component 113 can include various circuitry to facilitate selection of superblocks and control of the storage of data in the memory cells of the memory devices 130, 140. For example, the media management superblock component 113 can include a special purpose circuitry in the form of an ASIC, FPGA, state machine, and/or other logic circuitry or software and/or firmware that can allow the media management superblock component 113 to orchestrate and/or perform data storage operations related to determining which superblocks to use for storage and communicate to various components, data paths, and/or interfaces of the memory sub-system 110.

The media management superblock component 113 can be communicatively coupled to the memory devices 130, 140 and can access the memory device 130, the memory device 140, internal data paths of the memory sub-system 110, and/or interfaces of the memory sub-system 110 to perform the operations described herein and/or to transfer storage data to additional elements of the memory sub-system 110. In some embodiments, the operations performed by the media management superblock component 113 can be performed during an initialization or pre-initialization stage of data transfer within the memory sub-system 110 and/or the memory sub-system controller 115.

In some embodiments, the memory sub-system controller 115 includes at least a portion of the media management superblock component 113. For example, the memory sub-system controller 115 can include a processor 117 (processing device) configured to execute instructions stored in local memory 119 for performing the operations described herein. In some embodiments, the media management superblock component 113 is part of the host system 110 (not illustrated), an application, or an operating system.

The memory devices 130, 140 in FIG. 1 can include a number of physical blocks in accordance with some embodiments of the present disclosure. For example, the memory devices 130, 140 can include a NAND flash memory array including the number of physical blocks. However, embodiments of the present disclosure are not limited to a particular type of memory or memory array. For example, the memory array can be a DRAM array, an RRAM array, or a PCRAM array, among other types of memory arrays. Further, the memory array can be located on a particular semiconductor die along with various peripheral circuitry associated with the operation thereof.

The memory cells of the memory array can be mixed mode cells operable as SLCs and/or XLCs (e.g., extra-level cells which can refer to cells operable at a level greater than SLCs, also referred to as non-SLC mode cells). The number of physical blocks in the memory array can be 128 blocks, 512 blocks, or 1,024 blocks, but embodiments are not limited to a particular multiple of 128 or to any particular number of physical blocks in memory array. Further, different portions of memory can serve as a dynamic SLC cache for media management operations, such as garbage collection. For example, different portions of memory can be dynamically increased and/or decreased in size as demands on the memory are increased and/or decreased and garbage collection more efficiently address these demands.

Each physical block of the memory array can contain a number of physical rows of memory cells coupled to access lines (e.g., word lines). The number of rows (e.g., word lines) in each physical block can be 32, but embodiments are not limited to a particular number of rows per physical block. Further, the memory cells can be coupled to sense lines (e.g., data lines and/or digit lines).

Each row can include a number of pages of memory cells (e.g., physical pages). A physical page refers to a unit of programming and/or sensing (e.g., a number of memory cells that are programmed and/or sensed together as a functional group). Each row can comprise one physical page of memory cells. However, embodiments of the present disclosure are not so limited. For instance, in a number of embodiments, each row can comprise multiple physical pages of memory cells (e.g., one or more even pages of memory cells coupled to even-numbered bit lines, and one or more odd pages of memory cells coupled to odd numbered bit lines). Additionally, for embodiments including XLCs, a physical page of memory cells can store multiple pages (e.g., logical pages) of data, for example, an upper page of data and a lower page of data, with each cell in a physical page storing one or more bits towards an upper page of data and one or more bits towards a lower page of data.

In a non-limiting example, an apparatus (e.g., the computing system 100) can include a memory sub-system media management superblock component 113. The memory sub-system media management superblock component 113 can be resident on the memory sub-system 110. As used herein, the term "resident on" refers to something that is physically located on a particular component. For example, the memory sub-system media management superblock component 113 being "resident on" the memory sub-system 110 refers to a condition in which the hardware circuitry that comprises the memory sub-system media management superblock component 113 is physically located on the memory sub-system 110. The term "resident on" can be used interchangeably with other terms such as "deployed on" or "located on," as referred to herein.

The memory sub-system media management superblock component 113 can be configured to determine whether a particular superblock includes a number of bad blocks (i.e., blocks that are no longer functional or that cannot be used to store data). The memory sub-system media management superblock component 113 can determine to store data in the particular superblock based on the number of bad blocks, along with other parameters described below in association with FIGS. 2-5.

Figure 2:
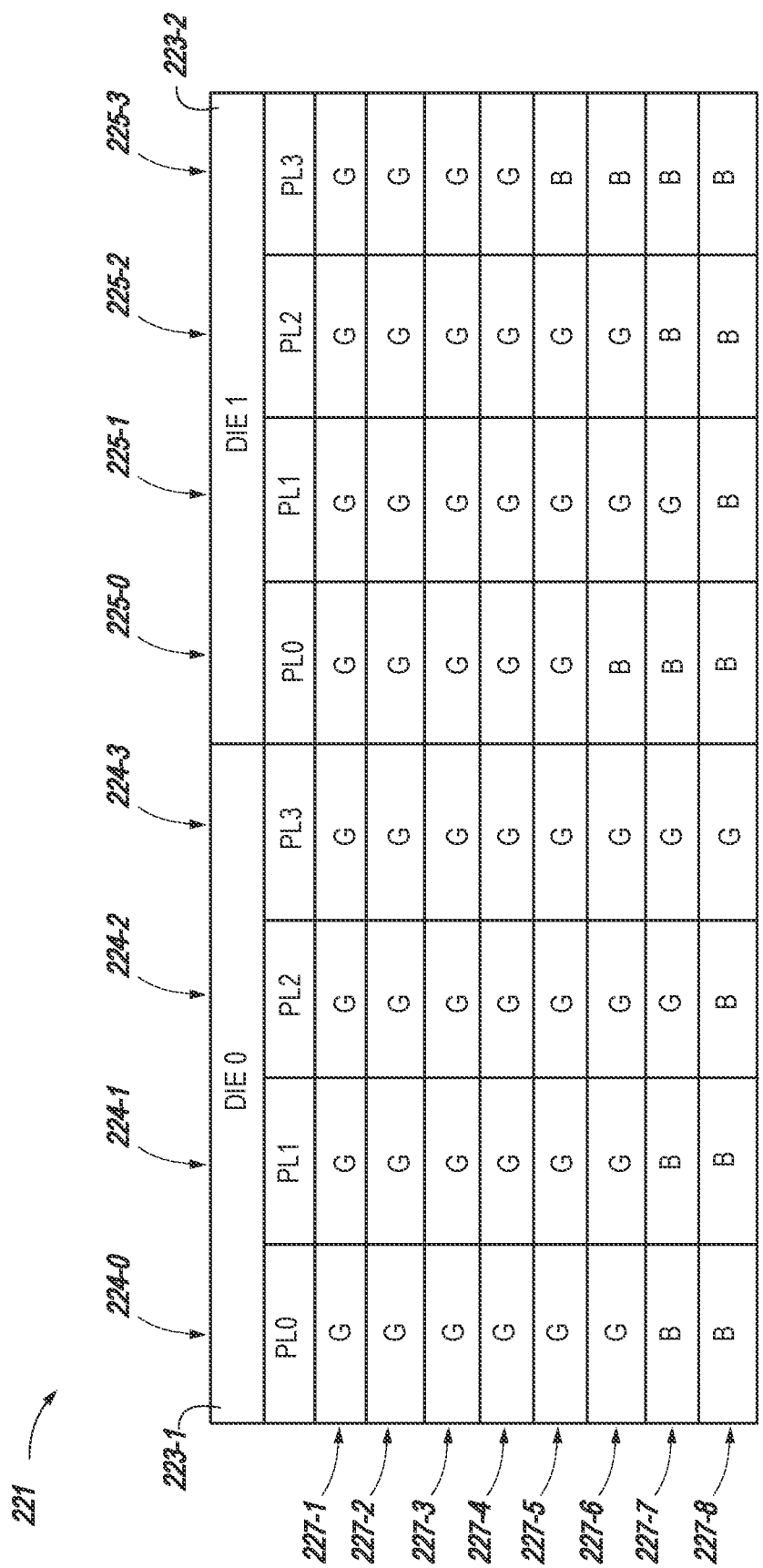
FIG. 2 illustrates an example of a non-volatile memory array for using partial superblocks in accordance with some embodiments of the present disclosure.

FIG. 2 illustrates an example of a non-volatile memory array 221 for using partial superblocks in accordance with some embodiments of the present disclosure. In some embodiments, the non-volatile memory array 221 can be a NAND memory array. In some embodiments, the non-volatile memory array 221 can be resident on a mobile computing device such as a smartphone, laptop, phablet, Internet-of-Things device, autonomous vehicle, or the like. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

The non-volatile memory array 221 can include a number of dies ("DIE 0") 223-1 and ("DIE 1") 223-2 (hereinafter referred to as number of dies 223). Each of the number of dies 223-1, 223-2, can include a number of planes 224-0 through 224-3 (e.g., "PL0" through "PL3" of "DIE 0" 223-1) and 225-0 through 225-3 (e.g., "PL0" through "PL3" of "DIE1" 223-2). These number of dies 223 and number of planes 224, 225, can include a quantity of superblocks 227-1 to 227-8 (hereinafter referred to collectively as a quantity of superblocks 227). Each of the blocks of the quantity of superblocks 227 can be referred to as a good block ("G") or a bad block ("B"). A good block refers to a block that can store data and is still functional. A bad block refers to a block that can no longer store data, may contain errors, and/or may be non-functional.

A "full" superblock can refer to a superblock that includes a particular number of good blocks. For example, a first superblock 227-1 includes all blocks (e.g., all blocks designated as "G") across the planes of both die 223-1 and die 223-2 and is a full superblock. Likewise, a second 227-2, third 227-3, and fourth 227-4 superblock are full superblocks. These full superblocks (227-1 to 227-4) can be referred to as having 100% performance or, put another way, performance that is not affected by a bad block.

A partial superblock can refer to a superblock with at least one bad block. For example, a fifth superblock 227-5 includes a bad block (e.g., "B") in a third plane 225-3 of a second die 223-2. In this way, the fifth superblock 227-5 may see a 12.5% reduction in performance when compared to a full superblock. Likewise, a sixth superblock 227-6 includes two bad blocks and may see a 25% reduction in performance, a seventh superblock 227-7 includes five bad blocks and may see a 62.5% reduction in performance, and an eighth superblock 227-8 includes seven bad blocks and may see an 87.5% reduction in performance.

In prior approaches referred to above, the fifth 227-5, sixth 227-6, seventh 227-7, and eighth 227-8 superblocks may have been discarded or ignored when processing data in the non-volatile memory array 221. However, as will be described further below, these four superblocks (227-5 through 227-8) are used as partial superblocks while minimizing the effect of using partial superblocks on performance. In order to lessen a yield loss that may occur if these partial superblocks were not used, a system is created to use partial superblocks in a similar manner as full superblocks. Three parameters that minimize the effects of using a partial superblock include a number of acceptable block loss (ABL), an amount of host data bytes written between writing partial superblocks (HWBS), and when to start using partial superblocks (SPS).

In regards to the number of acceptable block loss (ABL), a number of block loss in a superblock will be determined based on a decrease in performance of the memory system. For example, if a particular number of bad blocks reduces performance of the memory system by a particular degree, the partial superblock with that number of bad blocks may not be used. The particular number of bad blocks can be determined at a beginning of usage of the memory system by a user, subsequent to manufacturing testing, at a particular life cycle in the usage of the memory system, etc. That is, the particular number of acceptable bad blocks can be a variable that is adjusted based on a number of parameters at different stages of usage of the memory device.

In regards to the parameter related to an amount of host data byes written between writing the partial superblocks (HWBB), the HWBB parameter can ensure that the performance of the memory system does not drop consecutively. For example, the effect that using a partial superblock has on system performance can be spread out over time or diluted by limiting the number of times it is used during a particular period of writing. By spacing out the usage of the partial superblocks, the performance of the memory system can be maintained at a particular level across the lifetime of the memory system. In regards to parameter related to the start of usage of partial superblocks (SPS), the SPS parameter can determine when to use the partial superblock. For example, a partial superblock should not be used during an early life cycle of the memory system. Further, the partial superblock should not be used during benchmark settings and testing of the memory device.

Figure 3:
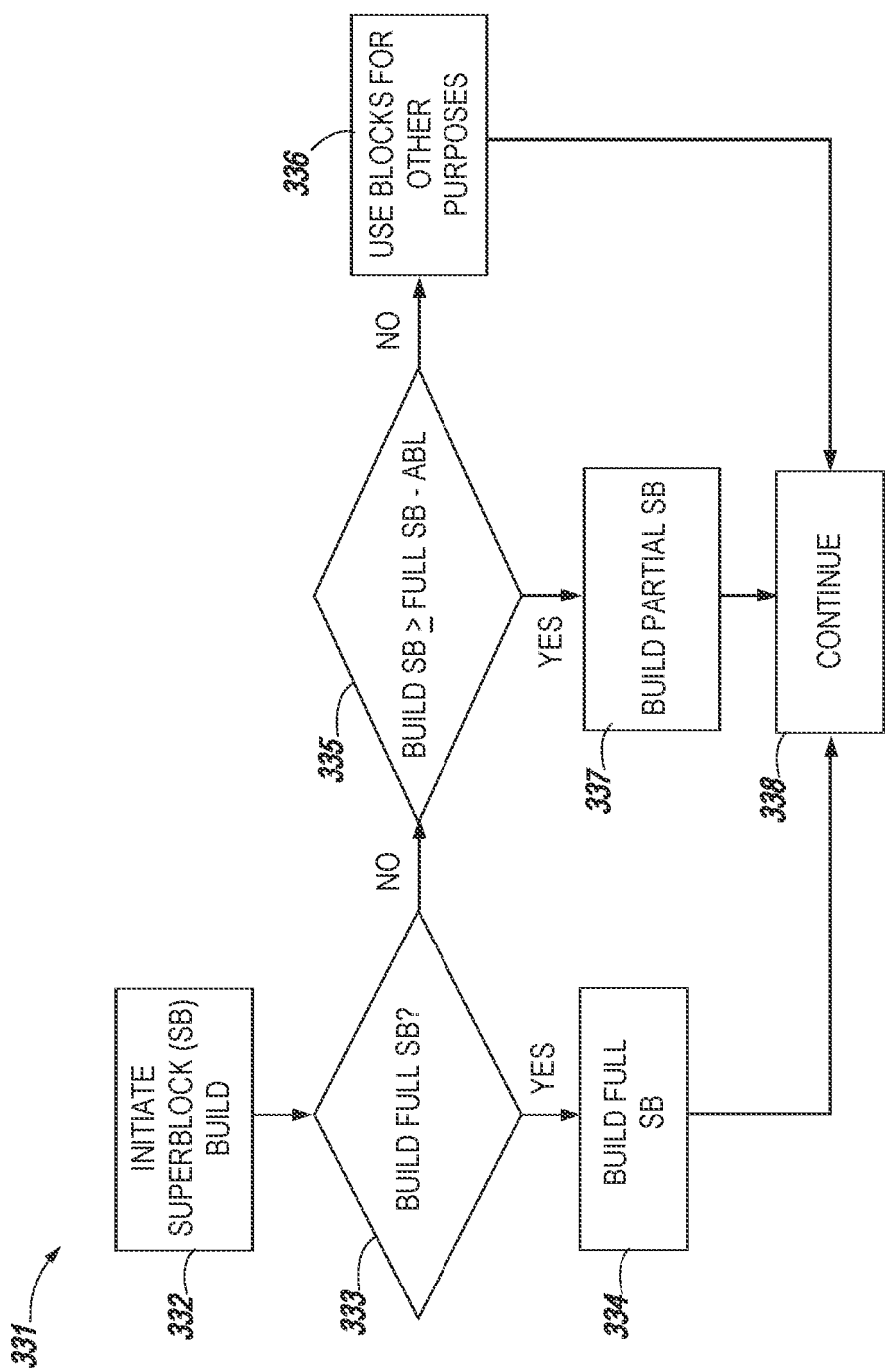
FIG. 3 illustrates an example flow diagram associated with using partial superblocks in accordance with some embodiments of the present disclosure.

FIG. 3 illustrates an example flow diagram 331 associated with using partial superblocks in accordance with some embodiments of the present disclosure. At operation 332, a media management superblock component (such as media management superblock component 113 in FIG. 1) can initiate building a superblock ("SB"). As an example, a memory system can begin to structure and build each of the superblocks (such as superblocks 227 in FIG. 2) in order to store data in the superblocks during memory operations.

At operation 333, the media management superblock component can determine whether a full superblock can be built (e.g., set up). As an example, a determination of whether the blocks of the superblock are good blocks or whether the superblock includes at least one bad block can be made. In response to a full superblock being able to be set up, at operation 334, a full superblock is built and, at operation 338, the memory operations continue. In response to a full superblock not being able to be built (e.g., due to inclusion of a bad block), at operation 335, a determination can be made as to whether the current superblock to be built is less than a size of a full super block (e.g., a number of blocks that make up a full superblock) minus the allowable block loss (ABL) number (e.g., "BUILD SB>FULL SB−ABL"). As an example, if a particular superblock (e.g., superblock 227-6 in FIG. 2) was being built, a determination of whether the number of good blocks (e.g., 6 in this example) is less than a full superblock block count (e.g., 8 in this example) minus an acceptable block loss (e.g., 2 for the purpose of this example if 2 blocks are acceptable to be lost per superblock for performance). In this example, 6≥8−2, so since 6 is greater than or equal to 6 (as 6 is equal to 6), the partial superblock (e.g., superblock 227-6) can be built (indicated by the "YES" to operation 337).

At operation 337, the partial superblock can be built and, at operation 338, the memory operations continue. However, in response to a partial superblock not meeting the parameter of operation 335 (e.g., such as superblock 227-7, which has 3 good blocks, so 3>8−3, and since 3 is not greater than (>) 5), at operation 336, the blocks of the partial superblock that does not meet the parameter can be used for other purposes, such as subsequent bad block replacement when it may meet the parameters of operation.

Figure 4:
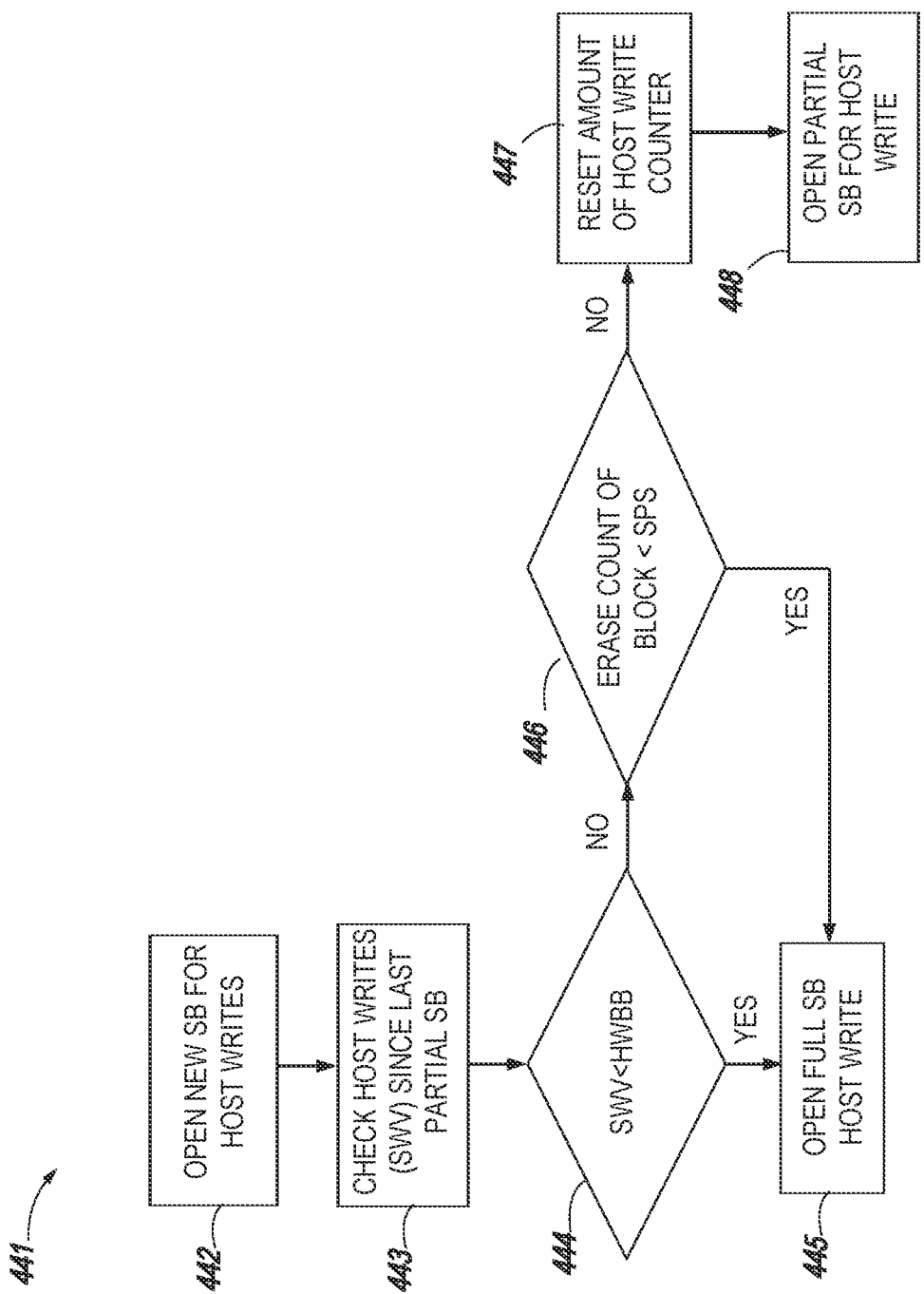
FIG. 4 illustrates an example flow diagram associated with using partial superblocks in accordance with some embodiments of the present disclosure.

FIG. 4 illustrates an example flow diagram 441 associated with using partial superblocks in accordance with some embodiments of the present disclosure. At operation 442, a media management superblock component (such as media management superblock component 113 in FIG. 1) can initiate opening a new superblock for host writes. At operation 443, the media management superblock component can check a superblock write value (e.g., check host writes since last partial superblock was written to). At operation 444, a comparison is made between the superblock write value ("SWV") and the HWBB. At operation 445, in response to the superblock write value ("SWV") being less than (indicated by "YES") the HWBB, a full superblock is opened for writing the host data (meaning the partial superblock is not written to at this time). The HWBB can also be referred to as the superblock write value criteria.

In response to the SWV being greater than the HWBB (illustrated by "NO," and indicating that the amount of data written since the last partial superblock was written to is greater than a threshold amount, or meets a criteria), an erase count of the superblock is compared to a value associated with start using a partial superblock (SPS), at operation 446. For example, an erase count of a full superblock in usage can indicate an amount of usage that the memory system has performed and indicate that the memory system is at a later stage in its memory life (e.g., that the memory system is closer to an end of life (EOL) condition that to a beginning of life (BOL) condition). The SPS value can be a criteria (or threshold value) that indicates a particular amount of usage of the full superblocks and can trigger usage of partial superblocks later in the memory life of the memory system.

In response to the erase count of a block being less than the SPS value, a full superblock can be opened for host writes, as indicated at operation 445. In response to the erase count being greater than the SPS value, at operation 447, a value in a host write counter can be reset. For example, the host write counter can be tracking a number of host writes that has occurred since a partial superblock was written and can be consulted to determine the superblock write value. In response to the host write counter reset, at operation 448, a partial superblock ("SB") can be opened for host writes.

Figure 5:
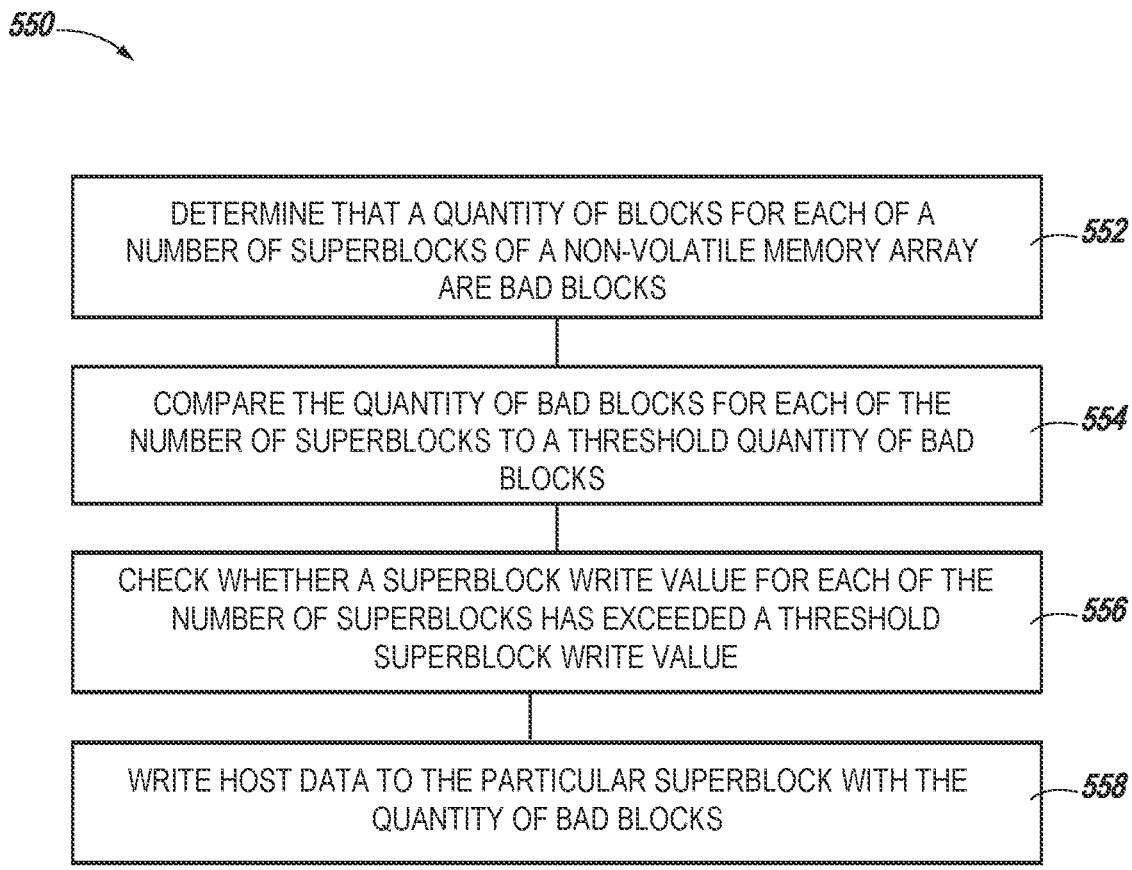
FIG. 5 illustrates an example method for using partial superblocks in accordance with embodiments of the present disclosure.

FIG. 5 is a flow diagram corresponding to a method 550 for performing memory sub-system operations for partial superblock usage using a media management superblock component in accordance with some embodiments of the present disclosure. The media management superblock component can be analogous to the media management superblock component in FIG. 1. The method 550 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 550 is performed by the media management superblock component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 552, a quantity of blocks for each of a number of superblocks of a non-volatile memory array can be determined to be bad blocks. The bad blocks can refer to blocks of memory for storing data that no longer function, that no longer hold correct data, that include errors when data is stored to them, etc. The quantity of bad blocks can be determined prior to native use, or use by a user. As an example, the bad blocks can be determined during a testing and/or manufacturing phase of the memory system.

At operation 554, the quantity of bad blocks for each of the number of superblocks can be compared to a bad block criteria (or threshold quantity of bad blocks). The bad block criteria can refer to an acceptable number of bad blocks (referred to earlier as the acceptable block loss or ABL) that does not decrease performance of the memory system below an acceptable level. This acceptable number of bad blocks, and therefore acceptable decrease in performance, can be variable and can be determined based on many different factors. These different factors can be influenced by user preferences, manufacturing preferences, etc. In some examples, an acceptable number of bad blocks can be one (1) bad block per super block so that performance may drop only about 10 percent.

At operation 556, whether a superblock write value for each of the number of superblocks meets a superblock write value criteria (or, in some instances, exceeds a threshold superblock write value) can be checked. The superblock write value indicates an amount of data written since a last partial superblock was written to. Further, as an example, the last partial superblock written to can include a last superblock that was written to that included at least one bad block.

At operation 558, host data can be written to the particular superblock with the quantity of bad blocks. In one example, writing the host data to the particular superblock can include writing the host data to good blocks of the particular superblock and refraining from writing the host data to the quantity of bad blocks of the particular superblock.

In some embodiments, the method can further include, in response to the host data being written to the particular superblock, resetting the superblock write value to zero. The method can further include incrementing the superblock write value by a numerical value in response to host data being written to a full superblock. The method can further include, in response to the superblock write value meeting the superblock write value criteria (e.g., in some instances, being less than a threshold quantity), writing host data to a different superblock that does not include a bad block.

Figure 6:
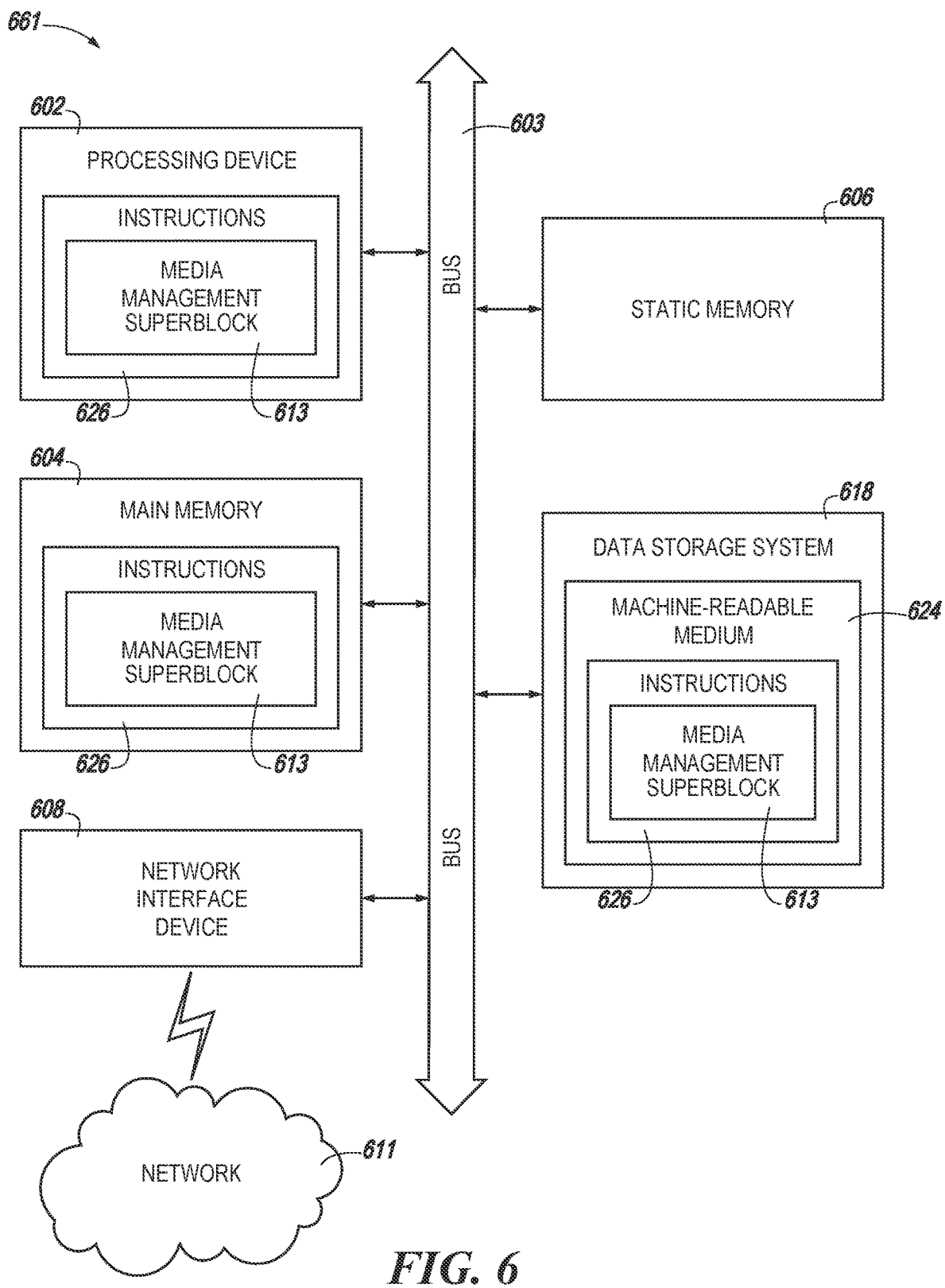
FIG. 6 is a block diagram of an example computer system in which embodiments of the present disclosure may operate.

FIG. 6 is a block diagram of an example computer system 600 in which embodiments of the present disclosure may operate. For example, FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media management superblock component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 603.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 611.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a media management superblock component (e.g., the media management superblock component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including solid state drives (SSDs), hard disk drives (HDDs), floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
   a media management superblock component configured to:
   determine that a quantity of blocks of a superblock of a non-volatile memory array are bad blocks;
   compare the quantity of bad blocks to a bad block criteria;
   determine whether a superblock write value of the superblock meets a superblock write value criteria, wherein the superblock write value is incremented by a numerical value of one in response to host data being written to a full superblock that does not include a bad block; and
   in response to the quantity of bad blocks meeting the bad block criteria and in response to the superblock write value meeting the superblock write value criteria, write host data to blocks of the quantity of blocks of the superblock that are not part of the quantity of bad blocks.

2. The apparatus of claim 1, wherein the superblock write value indicates an amount of data written since a last partial superblock was written to.

3. The apparatus of claim 2, wherein the media management superblock component is further configured to, in response to the superblock write value meeting the superblock write value criteria, write host data to the superblock with the quantity of bad blocks.

4. The apparatus of claim 2, wherein the media management superblock component is configured to, in response to the quantity of bad blocks meeting the bad block criteria or the superblock write value meeting the superblock write value criteria, or both, refrain from writing additional host data to the superblock with the quantity of bad blocks.

5. The apparatus of claim 1, wherein the media management superblock component is configured to, in response to the quantity of bad blocks meeting the bad block criteria, refrain from writing additional host data to the superblock.

6. The apparatus of claim 5, wherein the media management superblock component is configured to, in response to the quantity of bad blocks meeting the bad block criteria, use at least one block of the superblock to replace a block of a different superblock that includes an error.

7. The apparatus of claim 1, wherein the bad block criteria is equal to or greater than 12.5% of a total number of blocks of the superblock.

8. The apparatus of claim 1, wherein the bad block criteria is equal to or less than 25% of a total number of blocks of the superblock.

9. The apparatus of claim 1, wherein the non-volatile memory array is a NAND memory array resident on a mobile computing device.

10. The apparatus of claim 1, wherein the media management superblock component is further configured to:
    in response to an erasure count of the superblock meeting a first erasure count criteria, refrain from writing the host data to the superblock; and
    in response to the erasure count of the superblock meeting a second erasure count criteria, write the host data to the superblock.

11. A method, comprising:
    determining that a quantity of blocks for at least one of a number of superblocks of a non-volatile memory array are bad blocks;
    comparing the quantity of bad blocks for the at least one of the number of superblocks to a bad block criteria; and checking whether a superblock write value for each of the number of superblocks meets a superblock write value criteria, wherein:
the superblock write value indicates an amount of data written since a last partial superblock was written to; and
wherein the superblock write value is incremented by a numerical value of one in response to host data being written to a full superblock that does not include a bad block; and
in response to the quantity of bad blocks meeting the bad block criteria and the superblock write value meeting the superblock write value criteria for a particular superblock of the number of superblocks, writing host data to the particular superblock with the quantity of bad blocks.

12. The method of claim 11, wherein writing the host data to the particular superblock comprises writing the host data to good blocks of the particular superblock and refraining from writing the host data to the quantity of bad blocks of the particular superblock.

13. The method of claim 11, wherein the last partial superblock written to comprises a last superblock that was written to that included at least one bad block.

14. The method of claim 11, further comprising, in response to the host data being written to the particular superblock, resetting the superblock write value to zero.

15. The method of claim 14, further comprising incrementing the superblock write value by a numerical value in response to additional host data being written to a full superblock.

16. The method of claim 11, further comprising, in response to the superblock write value meeting the superblock write value criteria, writing additional host data to a different superblock that does not include a bad block.

17. An apparatus, comprising:
a memory device comprising a plurality of blocks of memory; and
a processing device coupled to the memory device, the processing device to perform operations comprising:
determining that a quantity of blocks of a superblock of a non-volatile memory array are bad blocks;
comparing the quantity of bad blocks to a bad block criteria;
in response to the quantity of bad blocks meeting the bad block criteria, checking whether a superblock write value meets a superblock write value criteria, wherein:
the superblock write value indicates an amount of data written since a last partial superblock was written to; and
the superblock write value is incremented by a numerical value of one in response to host data being written to a full superblock that does not include a bad block; and
in response to the superblock write value meeting the superblock write value criteria, writing data to the superblock with the quantity of bad blocks.

18. The apparatus of claim 17, wherein the processing device is to perform operations further comprising, in response to the quantity of bad blocks meeting the bad block criteria, delaying using the superblock with the quantity of bad blocks until a threshold number of read and write operations have been performed.

19. The apparatus of claim 17, wherein the processing device is to perform operations further comprising, in response to the superblock write value meeting the superblock write value criteria, writing the host data to a different superblock than the superblock.

20. The apparatus of claim 17, wherein the processing device is to perform operations further comprising preventing the host data from being written to the superblock in response to a determination than an erasure count associated with the particular superblock meets an erasure count criteria.

* * * * *